US 6,569,698 B2

(12) United States Patent
Wang et al.

(10) Patent No.: US 6,569,698 B2
(45) Date of Patent: May 27, 2003

(54) FOCUSING CUP ON A FOLDED FRAME FOR SURFACE MOUNT OPTOELECTRIC SEMICONDUCTOR PACKAGE

(75) Inventors: Bily Wang, Hsin-Chu (TW); Bill Chang, Hsin-Chu (TW); Chin-Mau James Hwang, Hsinchu (TW)

(73) Assignee: Harvatek Corp., Hsinchu (TW)

( * ) Notice: Subject to any disclaimer, the term of this patent is extended or adjusted under 35 U.S.C. 154(b) by 0 days.

(21) Appl. No.: 09/921,253

(22) Filed: Aug. 3, 2001

(65) Prior Publication Data

US 2002/0076849 A1 Jun. 20, 2002

Related U.S. Application Data

(63) Continuation-in-part of application No. 09/731,223, filed on Dec. 7, 2000.

(51) Int. Cl.$^7$ .............................................. H01L 21/00
(52) U.S. Cl. ............................ 438/26; 438/22; 438/27; 438/106; 438/121; 438/123
(58) Field of Search ........................ 257/98, 99, 676, 257/433, 434, 680, 81; 438/106, 121, 123, 22, 26, 27

(56) References Cited

U.S. PATENT DOCUMENTS 6,274,924 B1 * 8/2001 Carey et al.
6,365,922 B1 * 4/2002 Chang \* cited by examiner

*Primary Examiner*—Long Pham
(74) *Attorney, Agent, or Firm*—H. C. Lin

(57) ABSTRACT

A focusing cup is directly glued to two or more preformed folded metal frames. Parts of the top surfaces of the folded metal frames contact the electrodes of semiconductor device placed inside the focusing cup. The bottoms of the metallic frames serve as the bottom contacts for surface mounting to a motherboard. The preformed metallic frames need not withstand the stress of folding and the package can be made thinner than prior art. The elimination of the through holes makes the package narrower. The bottoms of the metallic frames can be aligned one side of the bottom surface of the package, so that the package can be surface-mounted normally to or in parallel with a motherboard with light emitting respectively in parallel with or normally to the surface of the motherboard.

11 Claims, 20 Drawing Sheets

FOCUSING CUP ON A FOLDED FRAME FOR SURFACE MOUNT OPTOELECTRIC SEMICONDUCTOR PACKAGE

This is a continuation-in-part of application Ser. No. 09/731,223 filed Dec. 7, 2000, now pending.

BACKGROUND OF THE INVENTION (1) Field of the Invention

This invention relates to surface mount optoelectric semiconductor device package, particularly to a package with a focusing cup.

(2) Brief Description of the Related Art

In many optoelectric semiconductor packages, a focusing cup is used to focus the emitted light. The prior art structure and fabrication steps are shown in FIGS. 1–5. FIG. 1 shows two metal plates 111, 112 with through holes 121, 122. FIG. 2 shows a focusing cup 13 mounted over the two metal plates 111, 112. The metal plates 111, 112 are supported on an insulating substrate 14. The cup 13 has a reflecting wall 131 and is made of the same insulating glue as the substrate 14. The glue feeds through the through holes 121, 122 to attach the cup 13 to the substrate 14 with the metal plates 111, 112 sandwiched in between. The inner ends of these plates form the bottom of the focusing cup and serve to contact the electrodes of a diode (not shown). The substrate 14 has two grooves 141, 142 at the bottom corners of the substrate 14. FIG. 3 shows the folding of the outside ends of the two metal plates 111, 112 at the edges of the substrate 14 to form two bottom contacts 151, 152 for surface mounting the diode package to a motherboard. FIG. 4 shows a transparent 3-dimensional view of the diode package. This figure shows how the end of the metal plate 111 is folded to provide a bottom contact 151 for surface mounting, and how the end of the metal plate 112 is folded to provide a bottom contact 152 for surface mounting. FIG. 5 shows the bottom view of the structure with bottom contacts 151, 152.

The foregoing structure needs a thick substrate 14 for attaching the focusing cup 13 through holes 121, 122 in the metal plates 111, 112 to withstand the folding stress of the metal plates. The thick substrate 14 increases the height of the package and the cost. The through holes make it necessary for the bottom contacts to be wider than the through holes.

SUMMARY OF THE INVENTION

An object of the present invention is to reduce the height of a diode package with a focusing cup. Another object of this invention is to reduce the width of the package. Still another object of the present invention is to reduce the cost of such a package.

These objects are achieved by using preformed folded frames without using through holes. The focusing cup is directly glued to at least two folded metallic frames. Parts of the top surfaces of the folded metallic frame contacts the electrodes of a semiconductor device placed inside the cup. The bottoms of the metallic frames serve as the bottom contacts for surface mounting to a motherboard. The preformed metallic frames eliminate the folding stress in the prior art, and therefore can be made thinner than prior art. The elimination of the through holes can reduce the width of the package.

DETAIL DESCRIPTION OF THE INVENTION

Figure 6:
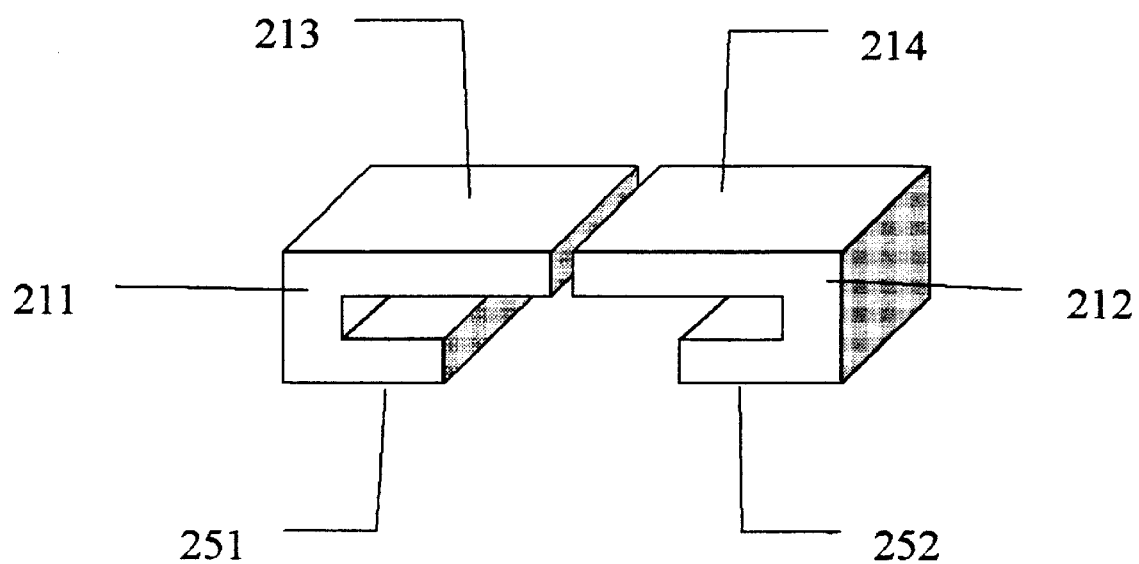
FIG. 6 shows the metal frames for mounting the focusing cup based on the present invention.

FIG. 6 shows the key elements of the present invention, which are the metal frames 211, 212 for supporting a focusing cup on the top surfaces 213, 214. The metal frames 211, 212 are made of two preformed metal plates folded inward at the ends to form two bottom contacts 251, 251 for surface mounting.

Figure 1:
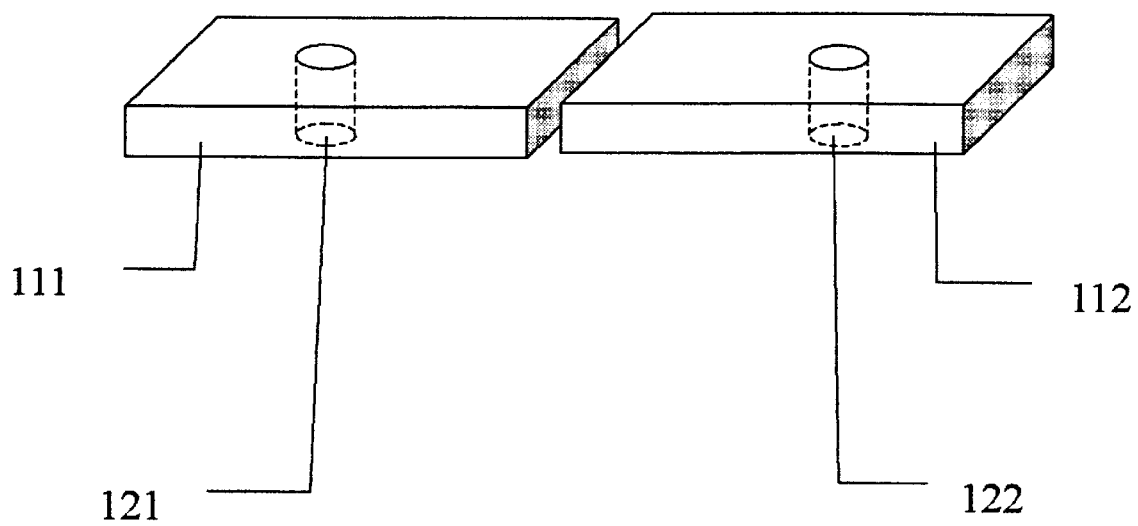
FIG. 1 shows a pair of metal plates for supporting a focusing cup of a prior art surface mount diode package.
Figure 2:
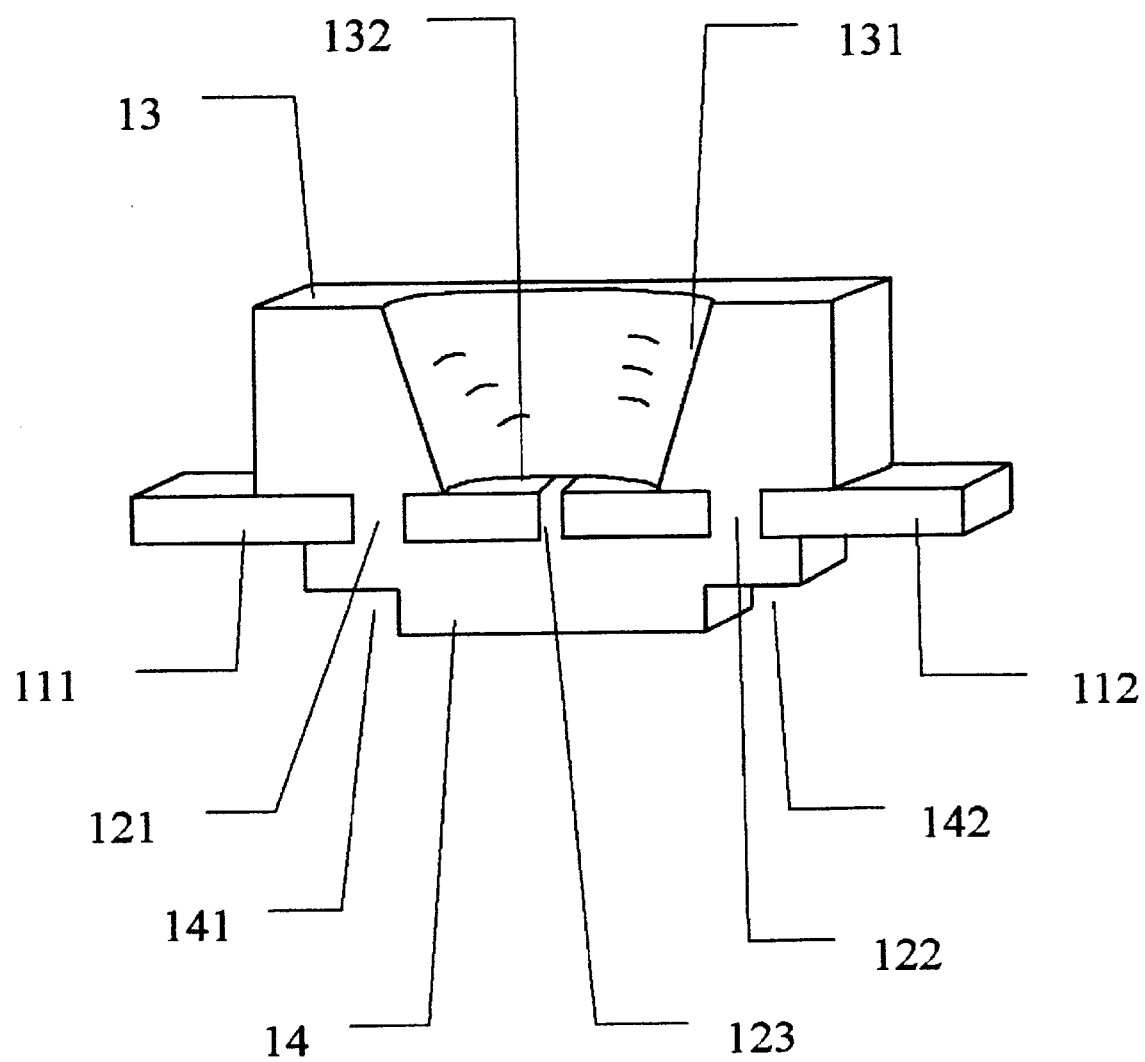
FIG. 2 shows how the focusing cup is mounted in FIG. 1.
Figure 3:
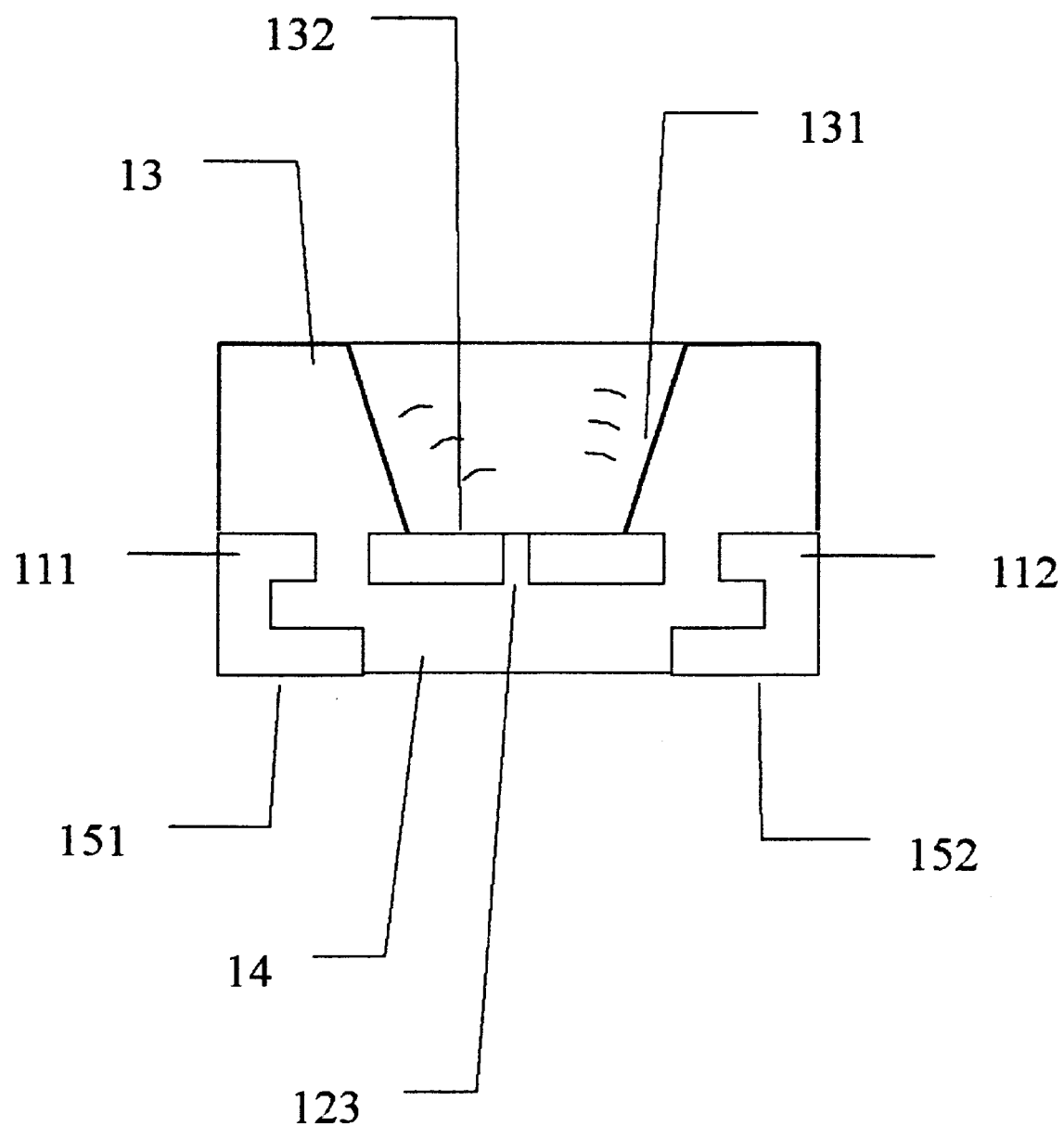
FIG. 3 shows the folding of the metal plates in FIG. 1 around a substrate to form contacts for surface mounting.
Figure 4:
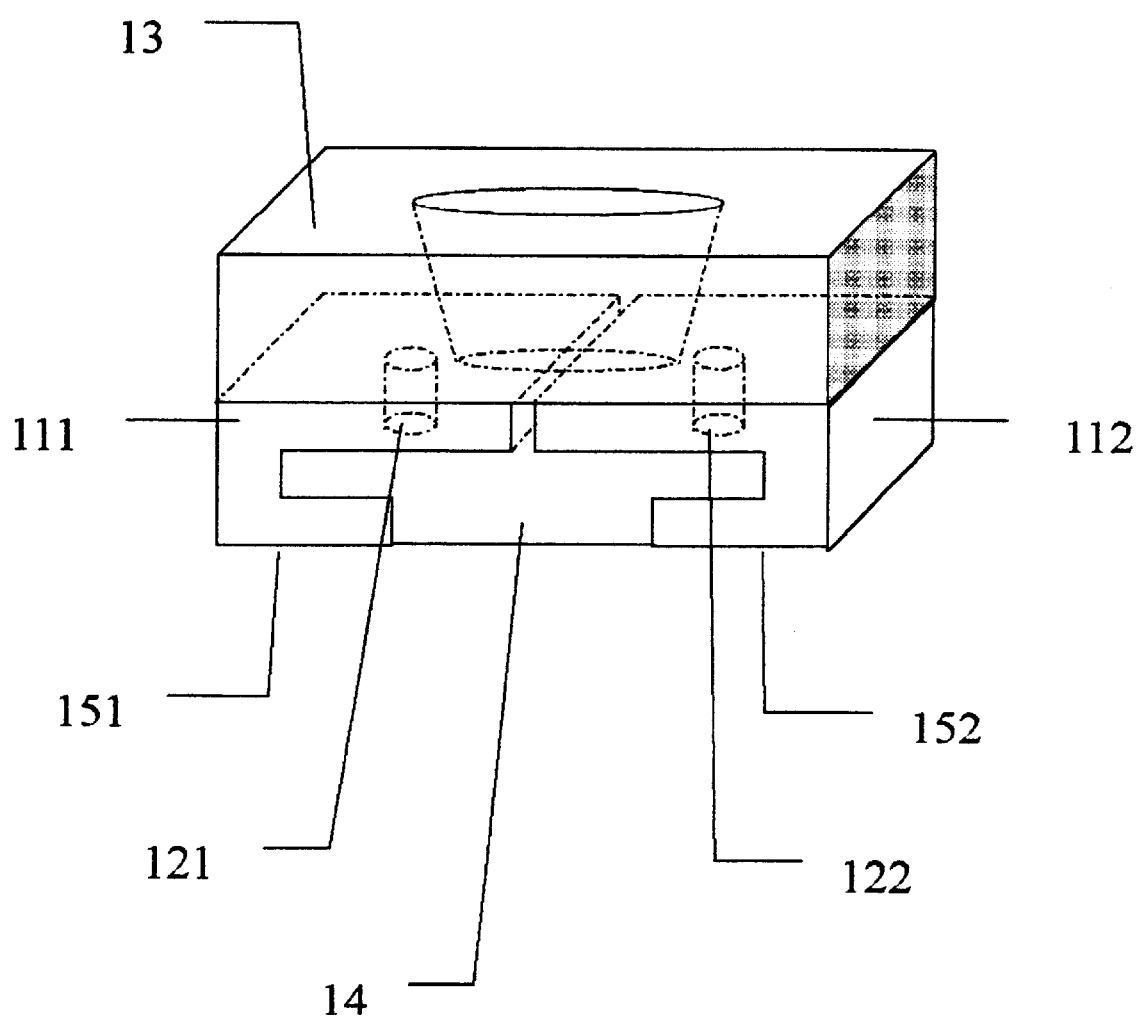
FIG. 4 shows a 3-dimensional transparent view of the prior art package shown in FIGS. 1–3.
Figure 5:
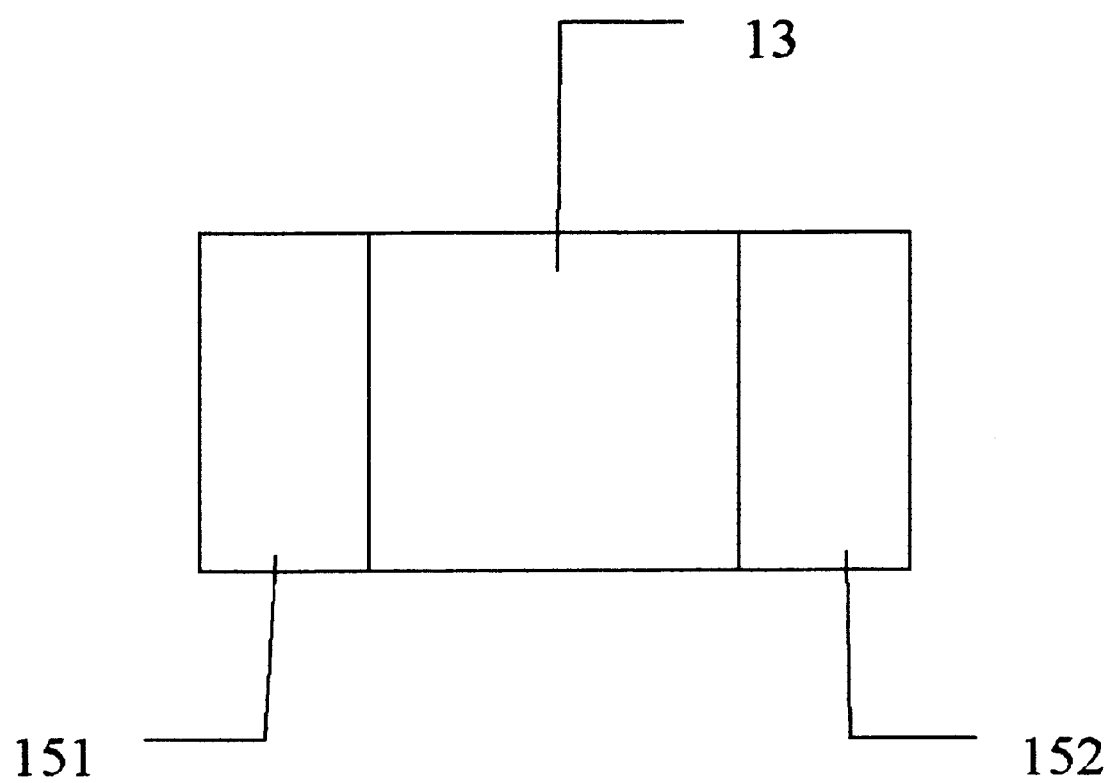
FIG. 5 shows the bottom view of the prior art package shown in FIG. 4.
Figure 7:
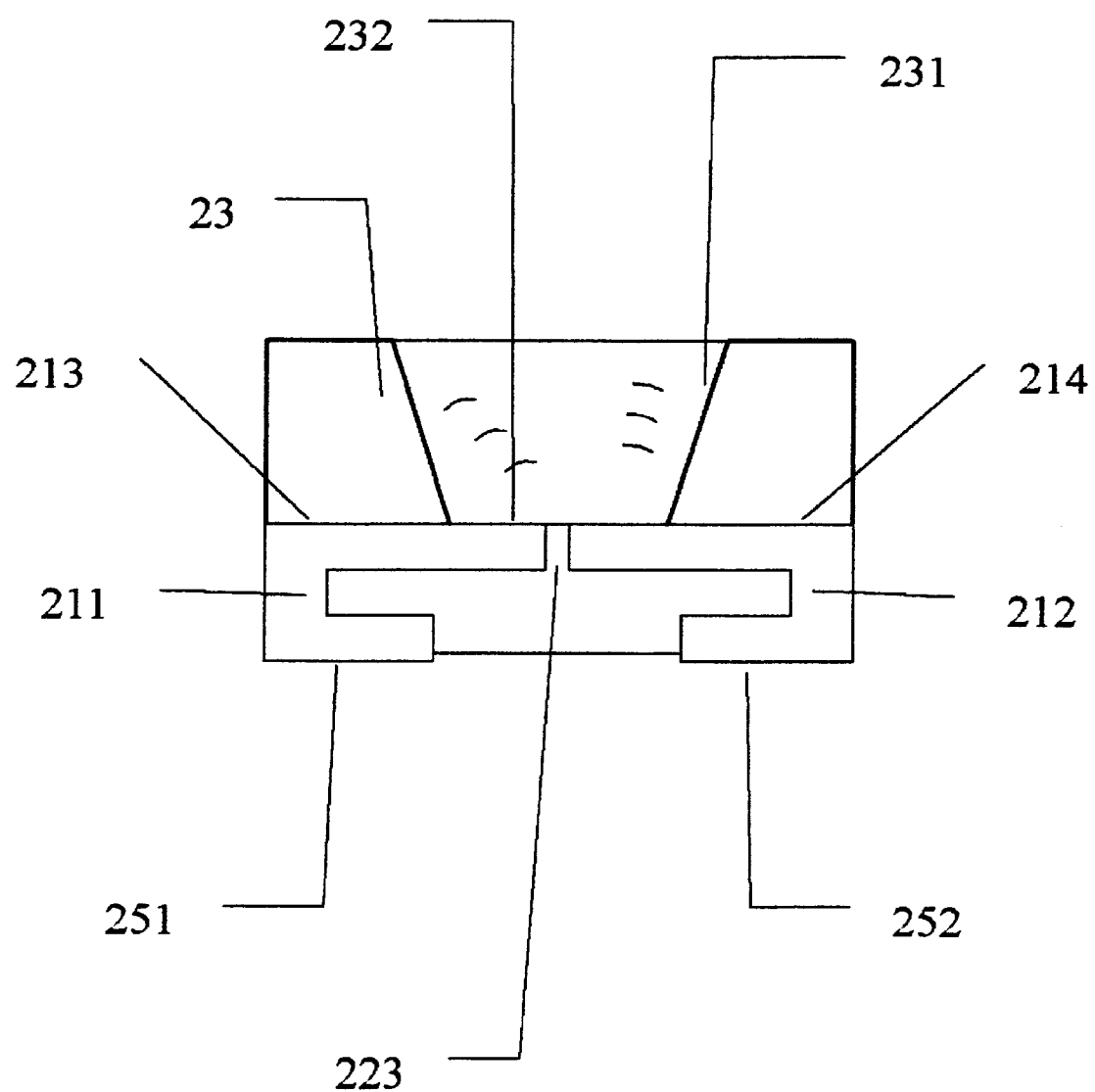
FIG. 7 shows a focusing cup cast over said metal frames.

FIG. 7 shows a focusing cup 231 mounted over the top surfaces 213, 214 of the folded metal frames 211, 212. The focusing cup 231 is formed by casting glue 23 over the top surfaces 213, 214, since the glue is made of plastic material. The unglued top surfaces 232 of the metal frames 211, 212 are exposed for contacting a diode (not shown). The wall of the focusing cup 231 is contoured to effect focusing of the light beam emitted from the diode and is lined with reflecting coating. A gap 223 is opened between the two metal frames to provide isolation. Thus the two metal frames 211, 212 serve as two electrodes for the diode and have bottom contacts for surface mounting. The metal frames 211, 212 are preformed. Since the frames are preformed, they do not have to withstand the folding stress of the prior art, and therefore can be made thinner. Since no through holes are used, the width 212 can be made narrower than the width 112 in FIG. 4, and the overall width of the package can be made narrower.

Figure 8:
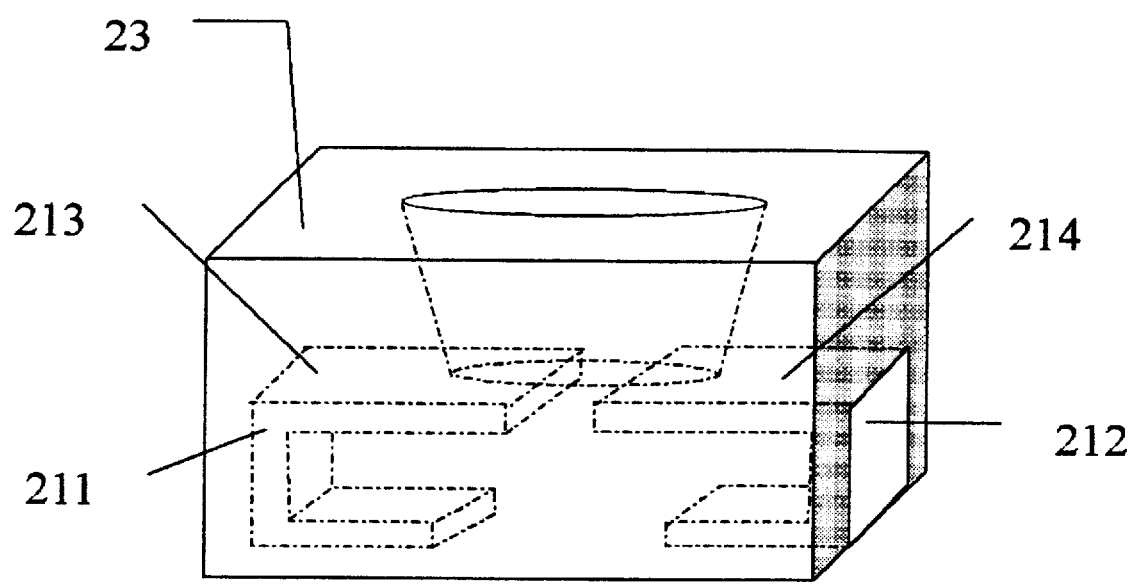
FIG. 8 shows a transparent 3-dimensional view of the present invention.

FIG. 8 shows a 3-dimensional transparent view of the package with glue 23 sealing the entire structure except the bottom opening of the focusing cup 231.

Figure 9:
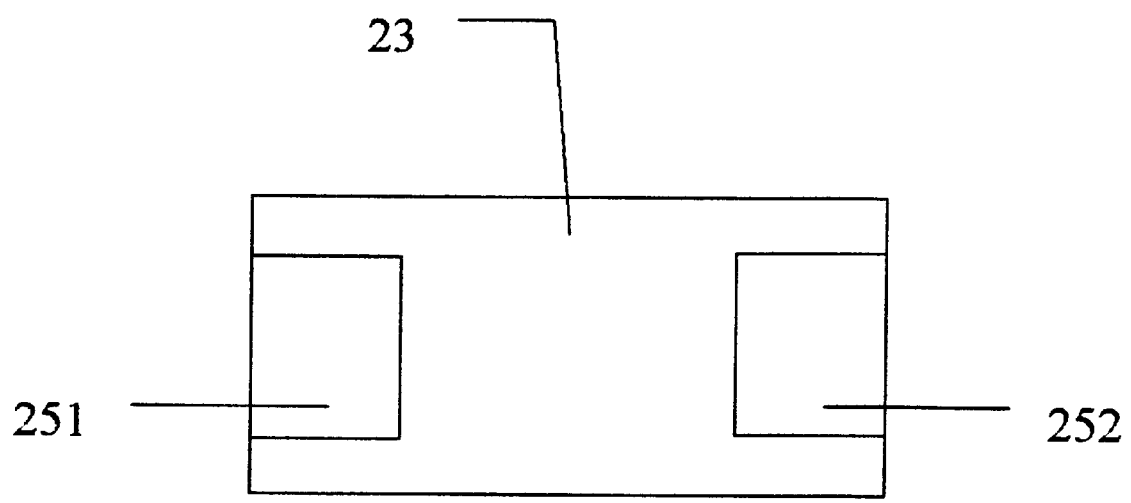
FIG. 9 shows the bottom view of the present invention.

FIG. 9 shows the bottom view of the package with two bottom contacts 251, 252 for surface mounting and surrounded by glue 23 outside the contacts.

Figure 10:
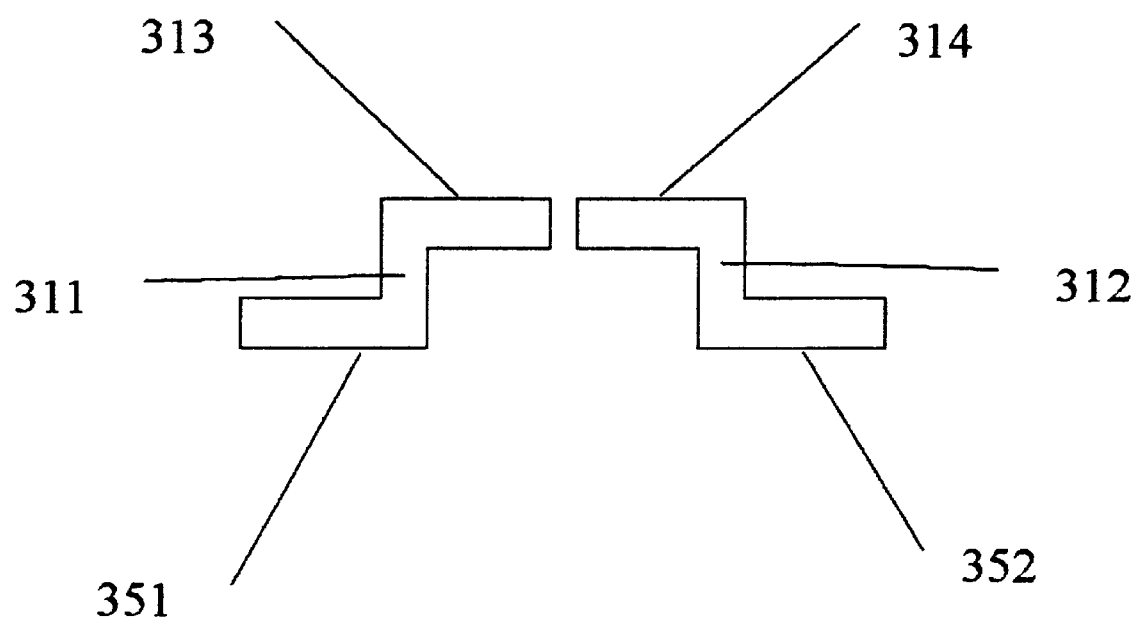
FIG. 10 shows a second embodiment of the metallic frames for mounting a focusing cup.

FIG. 10 shows a second embodiment of the present invention. The two metal frames 311, 312 are folded outward to form two flanges 351, 352 serving as contacts for surface mounting. The top surfaces 313, 314 of the metal frames 311, 312 are isolated from each other and support a diode on top.

Figure 11:
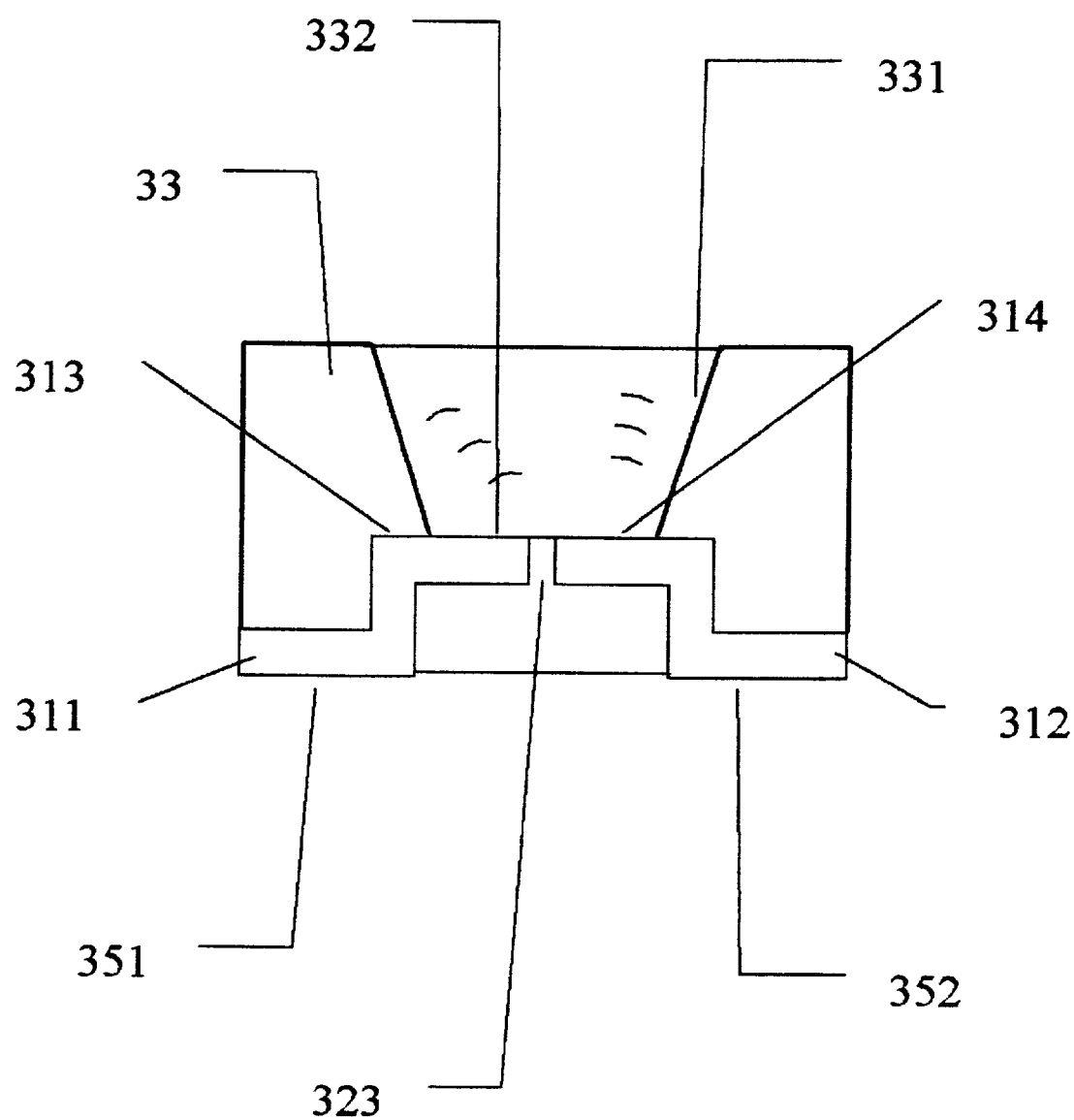
FIG. 11 shows the focusing cup is mounted on the frame in FIG. 10.

FIG. 11 shows a focusing cup 331 mounted over the two metal frames 311, 312. The cup has a contoured wall 331 for focusing light emitted from the diode. The plastic cup material 33 glues the cup over metal frames 311, 312. The bottom of the cup 331 is unglued for contacting the electrodes of the diode on the top surfaces 332, 314. A gap 323 provides isolation between the two electrodes. The bottom surfaces 351,352 serve as the contacts for surface mounting the package to a motherboard.

Figure 12:
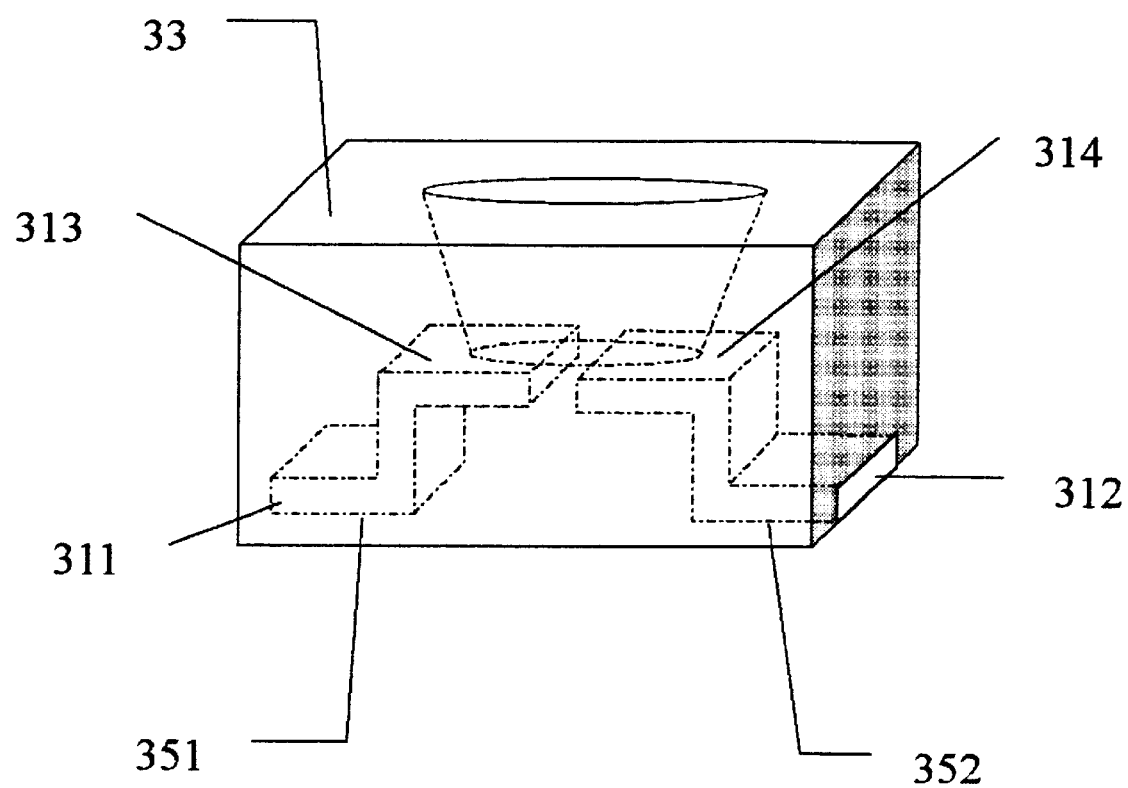
FIG. 12 shows a transparent 3-dimensional view of the structure shown in FIG. 11.

FIG. 12 shows a 3-dimensional transparent view of the package with glue 33 sealing the entire structure except the opening of the focusing cup.

Figure 13:
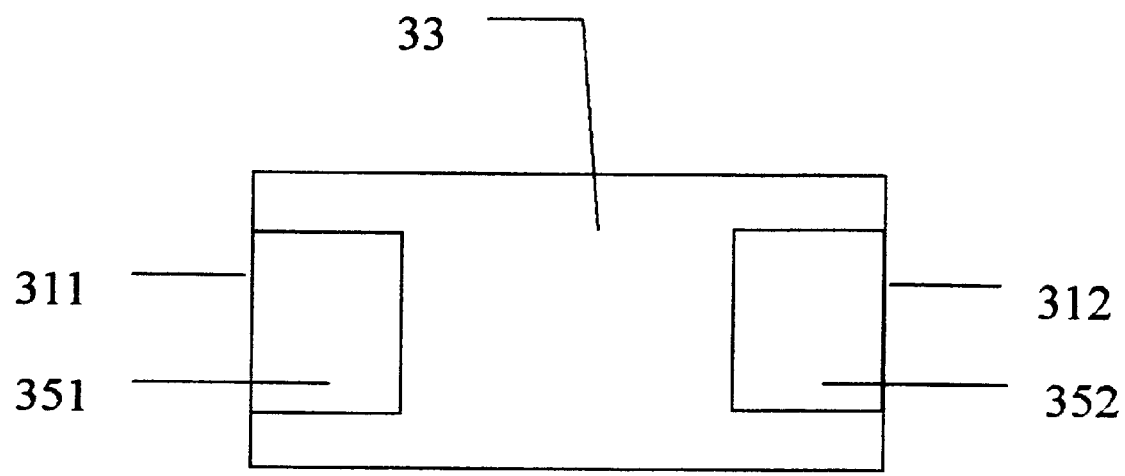
FIG. 13 shows the bottom view of FIG. 11.

FIG. 13 shows the bottom view of the package shown in FIG. 12 with two bottom contacts 351, 352 for surface mounting and surrounded by glue 33 outside the contacts 351,352.

Figure 14:
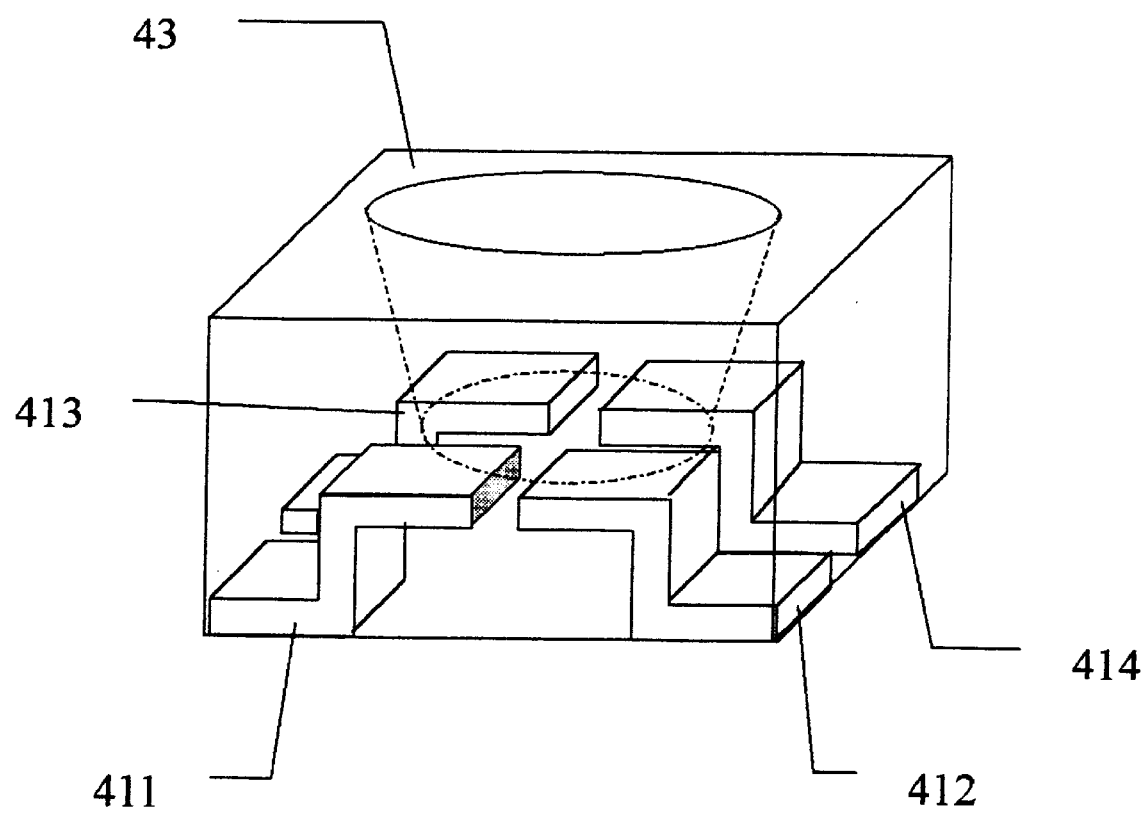
FIG. 14 shows a package with four metal frames.

FIG. 14 shows a third embodiment of the present invention. A four electrode semiconductor device (not shown) is mounted inside the focusing cup. Four preformed bent metal frames are used for contacts 411, 412, 413, 414. The shape of each metal frame is similar to that shown in FIG. 10 with an outwardly bent flange to serve as a bottom contact. A glue 43 is cast over the metal frames to form a focusing cup and to seal the entire structure except the bottom of the cup. The bottom of the cup is exposed for connecting the metal plates to the four electrodes of the semiconductor device.

Figure 15:
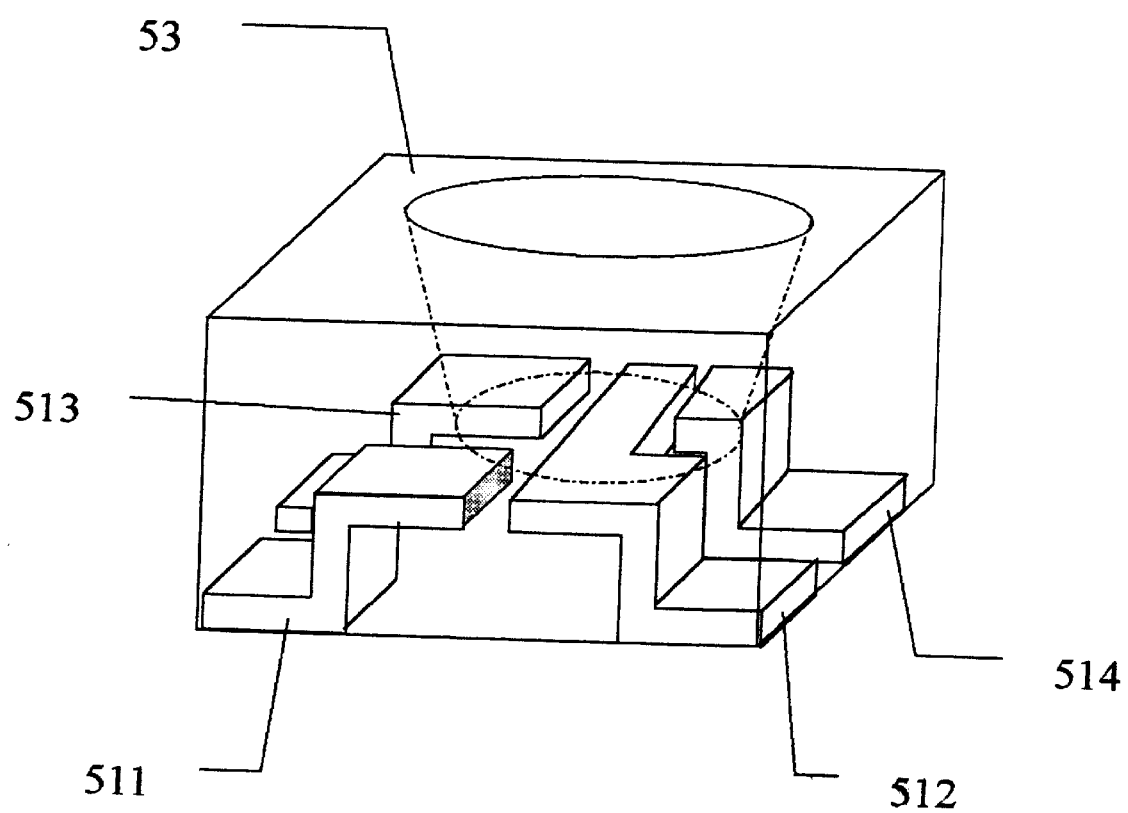
FIG. 15 shows another package with four metal frames.

FIG. 15 shows a fourth embodiment of the present invention. The structure is also for a four-electrode semiconductor device, similar to FIG. 14. However the bonding pads of the semiconductor device are not symmetrically located. Therefore, the shapes of the metal frames are not of the same shape to mate with the bonding pads of the semiconductor device. While the metal plates 511, 513 are similar in shape as metal plates 411, 413 in FIG. 14, the metal plates 512, 514 are different from metal plates 412, 414. Metal plate 512 has a zigzag shape and metal plate 514 has an L-shape. The shapes are not limited to these shapes, so long as the top surfaces of the metal frames can mate with the electrodes.

Figure 16:
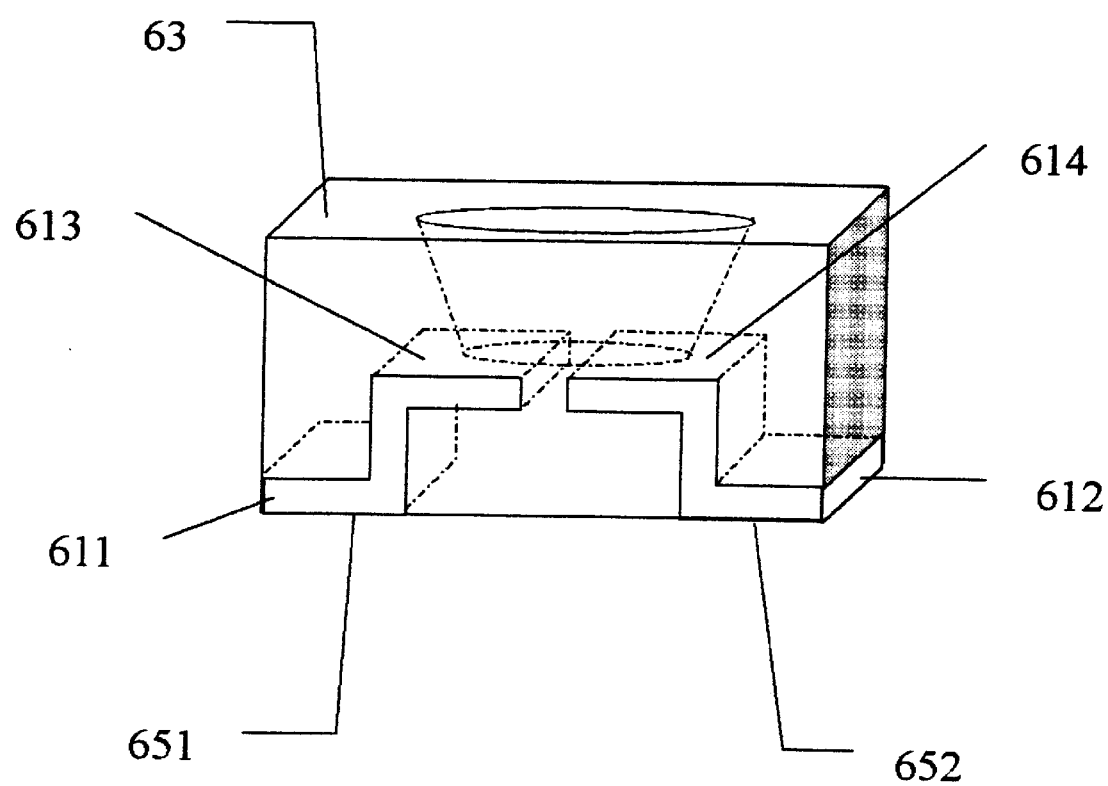
FIG. 16 shows a fifth embodiment of the invention, in which two metallic frames and the focusing cup casting are aligned at the bottoms in two directions to form an in-line package.

FIG. 16 shows a fifth embodiment of the present invention. The bottom contact 651 of metal plate 611 and the bottom contact 652 of metal plate 612 are aligned with the bottom of the focusing cup casting 63 along the same bottom plane, as well as along one direction normal to the same bottom plane. Thus, the sides of the metal plates 611 and 612 are aligned to form a single-row in-line package.

Figure 17:
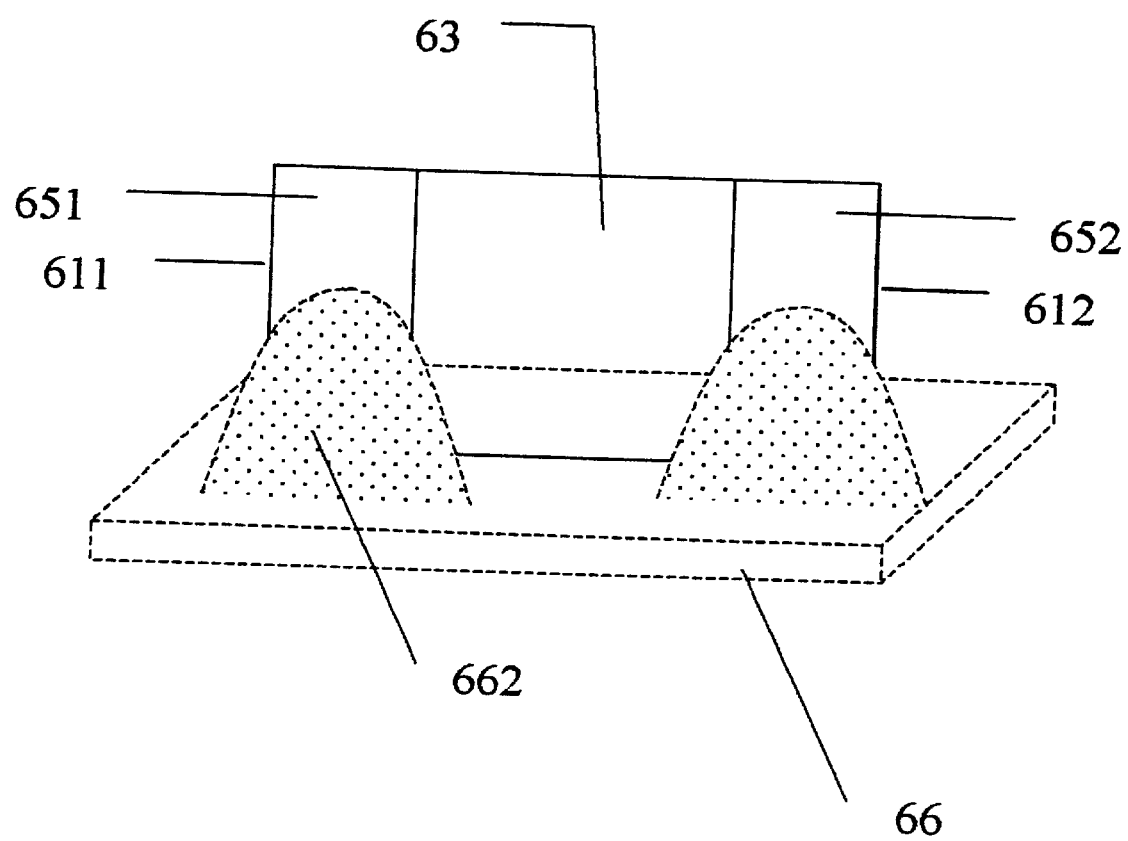
FIG. 17 shows the bottom of FIG. 16 mounted on a motherboard.

FIG. 17 shows how the package shown in FIG. 16 is turned 90° and surface-mounted onto the motherboard 66 as an in-line package. The soldering materials 662 separately couple the metals plates 611 and 612 to the motherboard 66.

Figure 18:
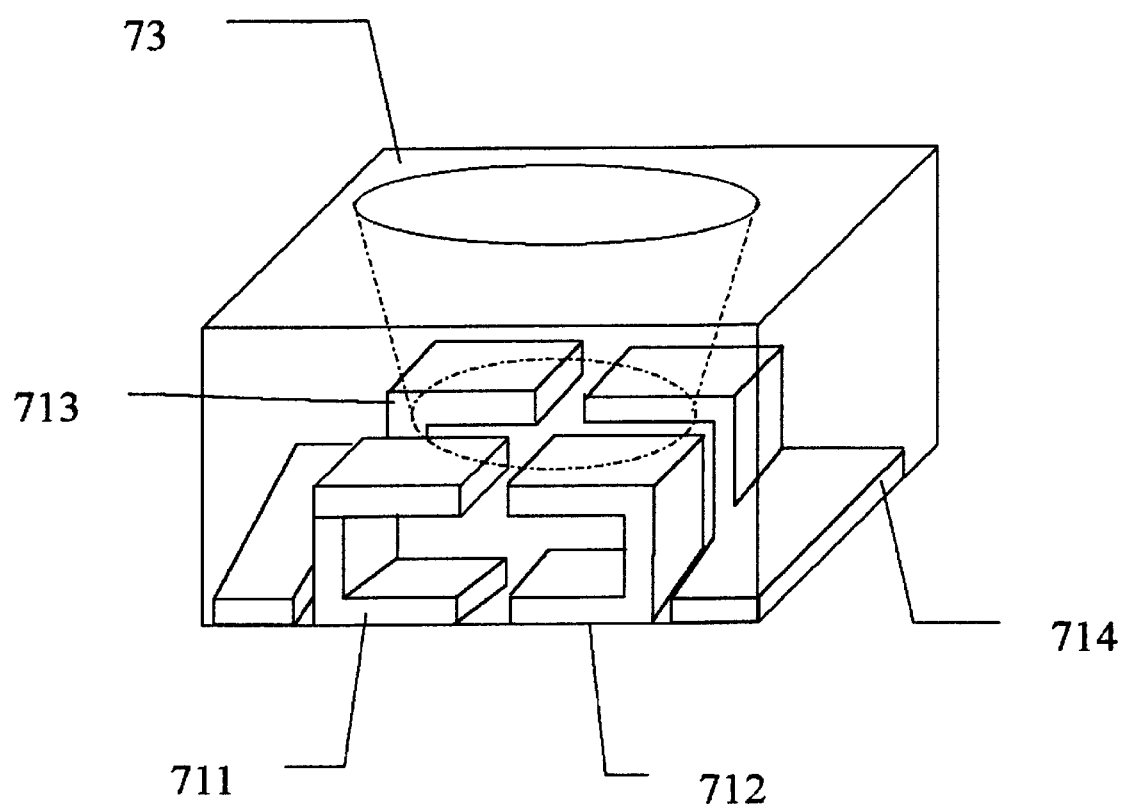
FIG. 18 shows a sixth embodiment of the present invention, in which multiple frames and focusing cup casting are aligned at the bottom in two directions to form an in-line package.

FIG. 18 shows a sixth embodiment of the present invention for a four-electrode package as shown in FIG. 14. Two of the electrodes 713 and 714 have extensions, such that the bottom contacts of the extensions of electrode 713 and 714 are lined up horizontally with the bottom contacts of electrodes 711 and 712 along the bottom plane, or along one direction normal to the same bottom plane. These bottom contacts 711, 712, 713 and 714 are aligned to form a single-row in-line package.

Figure 19:
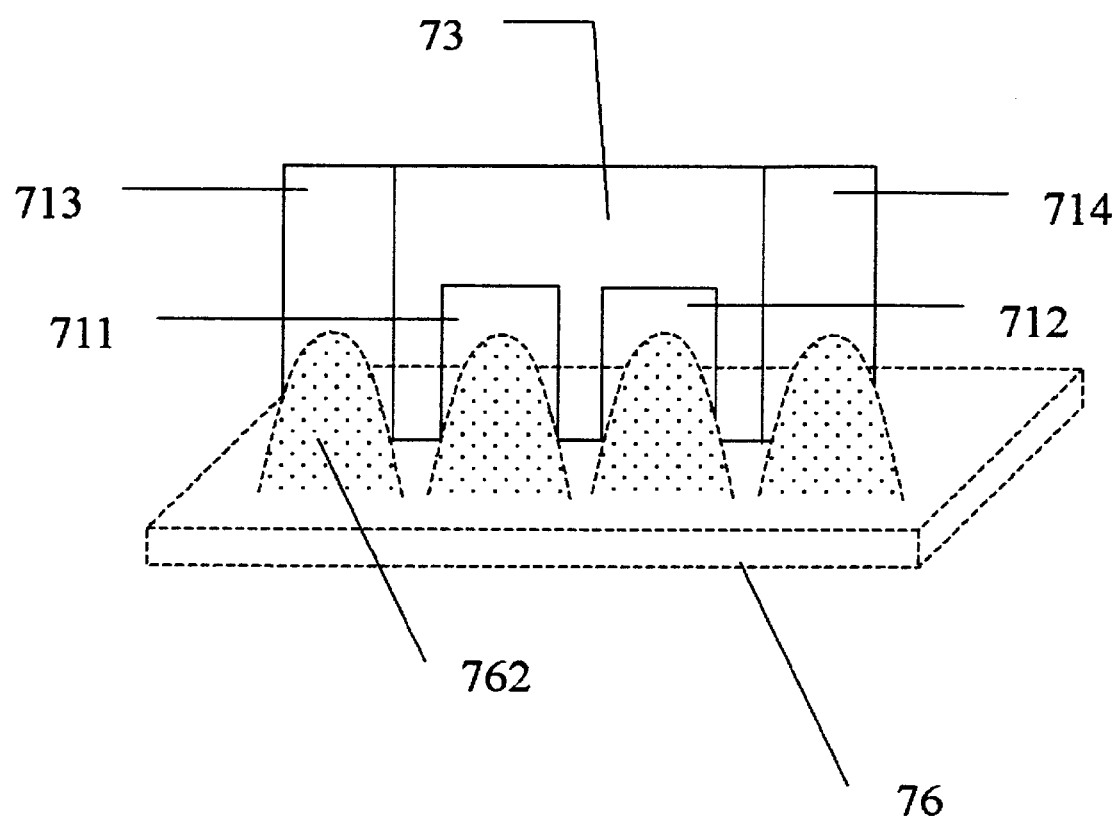
FIG. 19 shows the bottom of FIG. 18 mounted on a motherboard.

FIG. 19 shows how the in-line package of FIG. 18 can surface-mounted onto a motherboard 76. The in-line package shown in FIG. 8 is turned 90° and surface-mounted onto the motherboard. The soldering materials 762 couple the contact leads 711, 712, 713 and 714 to the motherboard.

Figure 20:
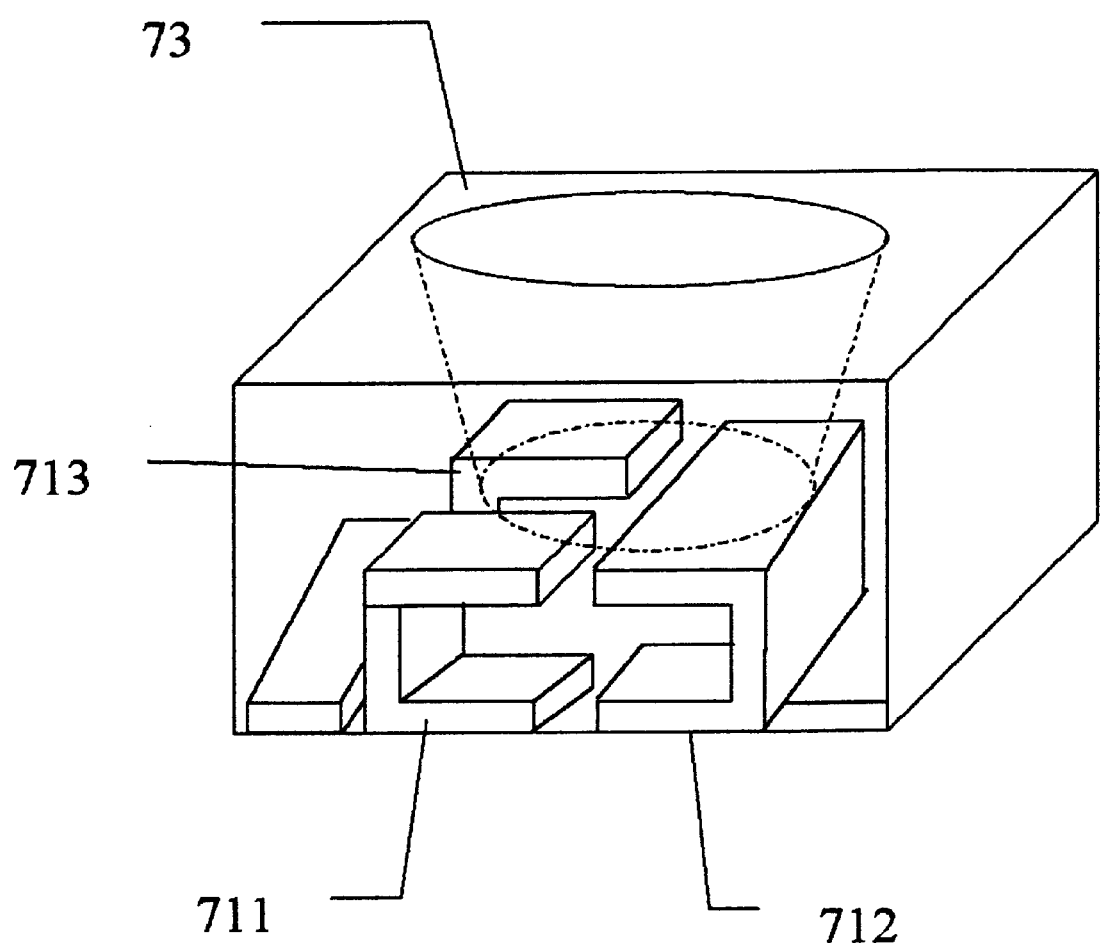
FIG. 20 shows a seventh embodiment similar to FIG. 16, except that there are three electrodes.

Although two and four in-line leads are described respectively in FIGS. 16,17 and 18,19, the structure is not limited two or four leads. For instance, a three-lead package as shown in FIG. 20 with electrode 713 lined up with electrodes 711, 712 and a cup 73, or any multiple-lead in-line package can be fabricated in a similar manner.

While the preferred embodiments of this invention have been described, it will be apparent to those skilled in the art that various modifications may be made in the embodiments without departing from the spirit of the present invention. Such modifications are all within the scope of this invention.

What is claimed is:

1. A method of fabricating a surface mount semiconductor device package with a focusing cup, comprising the steps of:

preforming folded metal frames, each having a top surface for contacting an electrode of a semiconductor device and a bottom surface serving as a contact for surface mounting to a motherboard, casting glue over said metal frames to form a cup over said top surface for focusing light emitted from said semiconductor device without covering an area for contacting said electrode and to adhere to said top surface as a unitary structure, and aligning the bottom surface of said folded metal frames along the bottom surface of the glue, so that the package can be surface-mounted to a motherboard to emit light in a direction in parallel to the surface of the motherboard when the package is mounted normally to the surface of the motherboard, and to emit light in a direction normal to the surface of the motherboard when the package is mounted in parallel with the surface of the motherboard.

2. The method of fabricating a surface mount semiconductor device package as described in claim 1, wherein said folded metal frames are folded inward.

3. The method of surface mount semiconductor device package as described in claim 1, wherein said folded metal frames are folded outward.

4. The method of fabricating a surface mount semiconductor device package as described in claim 1, wherein said semiconductor device is a diode.

5. The method of fabricating a surface mount semiconductor device package as described in claim 1, wherein said cup is contoured to focus said light.

6. The method of fabricating a surface mount semiconductor device package as described in claim 1, wherein said cup is lined with reflecting coating.

7. The method of fabricating a surface mount semiconductor device package as described in claim 1, wherein the top surfaces of said metal plates are shaped to mate with the bonding pads of the semiconductor device.

8. The method of fabricating a surface mount semiconductor device package as described in claim 7, wherein the top surfaces of the metal plates are of same shape.

9. The method of fabricating a surface mount semiconductor device package as described in claim 7, wherein the top surfaces of the metal plates are of different shapes.

10. The method as described in claim 1, wherein there are more than two said electrode and corresponding number of said contact.

11. The method as described in claim 10, wherein there are four of said electrode and four of said contact.

* * * * *